(12) United States Patent
Cook

(10) Patent No.: US 11,940,468 B2
(45) Date of Patent: Mar. 26, 2024

(54) MODULAR AMI/AMR IN-GROUND METER BOX

(71) Applicant: Nicor, Inc., Dripping Springs, TX (US)

(72) Inventor: Jeffrey A. Cook, Dripping Springs, TX (US)

(73) Assignee: NICOR, INC., Dripping Springs, TX (US)

( * ) Notice: Subject to any disclaimer, the term of this patent is extended or adjusted under 35 U.S.C. 154(b) by 135 days.

(21) Appl. No.: 17/248,740

(22) Filed: Feb. 5, 2021

(65) Prior Publication Data

US 2021/0318356 A1 Oct. 14, 2021

Related U.S. Application Data

(60) Provisional application No. 63/009,870, filed on Apr. 14, 2020.

(51) Int. Cl.
*G01R 11/04* (2006.01)
*G01R 22/06* (2006.01)
*G08C 17/02* (2006.01)

(52) U.S. Cl.
CPC ............ *G01R 11/04* (2013.01); *G01R 22/063* (2013.01); *G08C 17/02* (2013.01)

(58) Field of Classification Search
CPC ........ G01D 11/00; G01D 11/24; G01R 11/00; G01R 11/02; G01R 11/04; G01R 22/00; G01R 22/06; G01R 22/061; G01R 22/063
See application file for complete search history.

(56) References Cited

U.S. PATENT DOCUMENTS

| 6,414,605 | B1* | 7/2002 | Walden | G01D 4/008 |
| | | | | 343/719 |
| 6,749,080 | B1* | 6/2004 | White | E03B 7/095 |
| | | | | 137/381 |
| 7,360,553 | B1* | 4/2008 | Ismert | F16L 5/10 |
| | | | | 137/360 |
| 2003/0061974 | A1* | 4/2003 | Smyers | B65D 19/0012 |
| | | | | 108/57.33 |
| 2004/0200833 | A1* | 10/2004 | Dubois | B65D 19/18 |
| | | | | 220/6 |

(Continued)

FOREIGN PATENT DOCUMENTS

CN 203433020 U * 2/2014
CN 105823915 A * 8/2016
(Continued)

*Primary Examiner* — Huy Q Phan
*Assistant Examiner* — David B Frederiksen
(74) *Attorney, Agent, or Firm* — Andrew F. Young; NOLTE LACKENBACH SIEGEL

(57) ABSTRACT

An AMI/AMR in-ground meter box, including first and second side panels, each having an interior side and an exterior side; and first and second end panels, each having an interior side and an exterior side; wherein each of said side panels and end panels include a generally rectangular planar portion having a top edge, a bottom edge, a first interlocking end having a plurality of male elements and female slots, an arcuate second end having a 90-degree bend which forms a corner of the assembled meter box and terminating in an interlocking end having a plurality of male elements and female slots configured to interlock with paired male elements and female slots in said first interlocking end.

17 Claims, 5 Drawing Sheets

(56) References Cited

U.S. PATENT DOCUMENTS

| | | | | |
|---|---|---|---|---|
| 2007/0017916 A1* | 1/2007 | Sabanci | ............ | B65D 11/1833 |
| | | | | 220/7 |
| 2008/0238711 A1* | 10/2008 | Payne | ................... | G01D 4/008 |
| | | | | 340/870.02 |
| 2009/0145917 A1* | 6/2009 | Wojcik | ................... | E02D 29/00 |
| | | | | 220/810 |
| 2009/0173397 A1* | 7/2009 | Mallela | .................... | F16L 5/00 |
| | | | | 137/364 |
| 2009/0212049 A1* | 8/2009 | Anhel | ................. | B65D 19/18 |
| | | | | 220/4.28 |
| 2009/0277910 A1* | 11/2009 | Buttz | ................... | G01F 15/185 |
| | | | | 220/484 |
| 2020/0308811 A1* | 10/2020 | Brown | .................. | E03B 7/095 |

FOREIGN PATENT DOCUMENTS

| | | | | |
|---|---|---|---|---|
| CN | 106976626 A | * | 7/2017 | ......... B65D 21/0228 |
| CN | 106976626 A | | 7/2017 | |
| CN | 110316484 A | | 10/2019 | |
| CN | 209570122 U | | 11/2019 | |
| TW | M276808 U | | 10/2005 | |

\* cited by examiner

MODULAR AMI/AMR IN-GROUND METER BOX

CROSS REFERENCES TO RELATED APPLICATIONS

The present application claims the benefit of U.S. Provisional Patent Application Ser. No. 60/009,870, filed Apr. 14, 2020 (Apr. 14, 2020), which application is incorporated in its entirety by reference herein.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION BY REFERENCE OF MATERIAL SUBMITTED ON A COMPACT DISC

Not applicable.

SEQUENCE LISTING

Not applicable.

BACKGROUND OF THE INVENTION

Field of the Invention

The present invention relates generally to in-ground utility meter boxes, for AMI/AMR meters in AMI/AMR networks, and more specifically to an underground utility meter pit box or meter box for suspending an automatic meter reader antenna below the meter pit lid, the meter box having side and end panels joined in end-to-end interlocking joints with an adjustable mouse hole for incoming pipes, a snap-on gopher panel, and surface ribbing to prevent box migration. The box is configured to increase in strength as differential forces urge side panels in various directions.

Background Discussion

Automatic meter readers (AMRs) and Advanced Metering Infrastructure meters (AMI) are well known for tracking residential and commercial utility use. AMR/AMI transmitters are connected to the utility meter, where the meter and transmitter are installed in subsurface (in-ground) pit box or meter box for measuring water, electric, or gas service and communicating the measurements to technicians who poll the AMR/AMI from a handheld device or directly to the utility provider through signals transmitted to nearby cell service towers and forwarded to the service provider.

In most installations, the utility meter box is designed as a subsurface (recessed) container to be buried below ground level. The meter box is covered with a secure lid that protects the meter from water, debris, foot and vehicular traffic, weather, electrostatic charges, and unauthorized access (to prevent tampering and vandalism).

Conventional pit boxes are cylindrical or cuboid, the former bulky for transport and shipment, the latter generally having side joints that compromise strength and allow for independent migration or movement under the profound forces imparted on the box from moving soils. The present invention provides resolves each shortcoming.

BRIEF SUMMARY OF THE INVENTION

The present invention is an improved in-ground AMR/AMI meter box configured with side and end panels joined with end-to-end interlocking joints which increase box strength when subjected to external loads. Every force impinging on the box to put joined components in tension and that might pull it apart under tension simultaneously impart offsetting compressive force that actually increase joint strength. It is therefore a remarkably robust assembly.

The meter box is also configured with external surface features, such as ribbing, that increases panel strength and resists lateral movement of the panels. It includes adjustably sized, arched guillotine door slidably disposed over mouse holes for fitting utility pipes or conduit (water, electric, gas) disposed through the box for operational connection to an installed utility meter.

Importantly, the pit box is collapsible and then nestable in a stacked configuration for compact and easy transport.

These are only some of the more important features of the present invention. Other features characteristic of the invention, as to organization and method of operation, together with further objects and advantages thereof will be better understood from the following description considered in connection with the accompanying drawing, in which preferred embodiments of the invention are illustrated by way of example. It is to be expressly understood, however, that the drawing is for illustration and description only and is not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

BRIEF DESCRIPTION OF SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
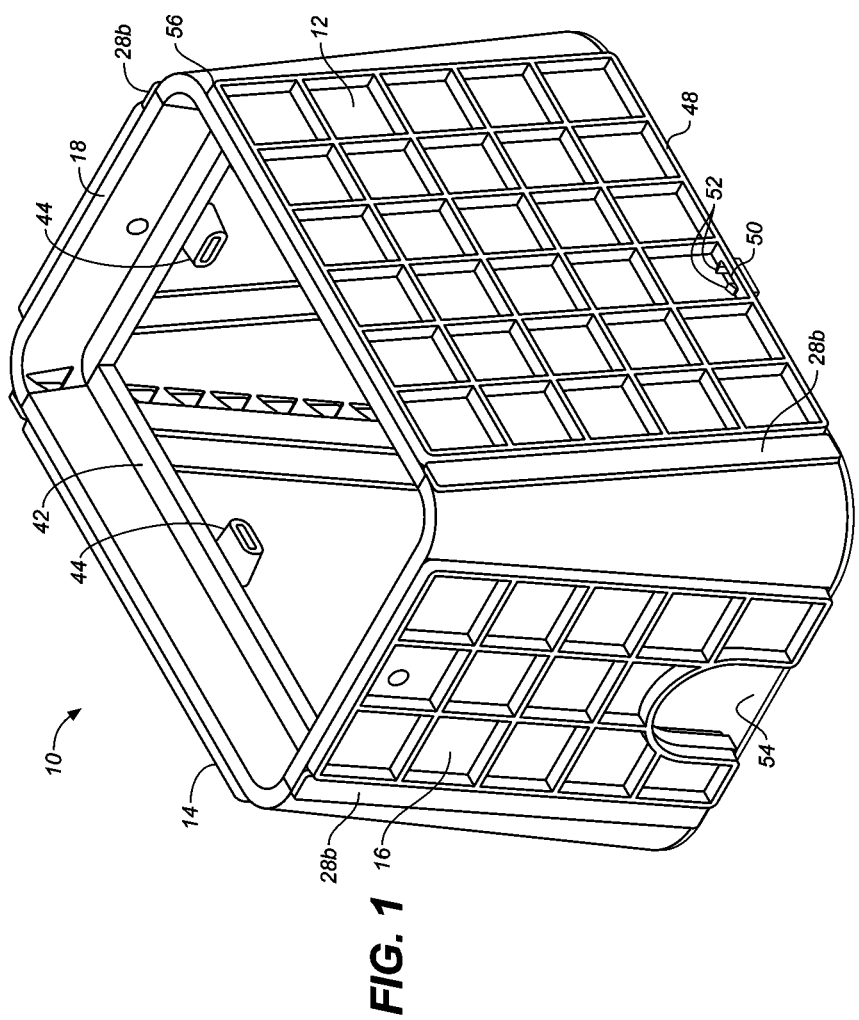
FIG. 1 is an upper perspective view of an embodiment of the modular AMR/AMI in-ground meter box of the present invention.

Referring to FIGS. 1 through 5, wherein like reference numerals refer to like components in the various views, there is illustrated therein a new and improved modular AMR/AMI in-ground box for sub-grade installation, the invention generally denominated 10 herein.

Figure 2:
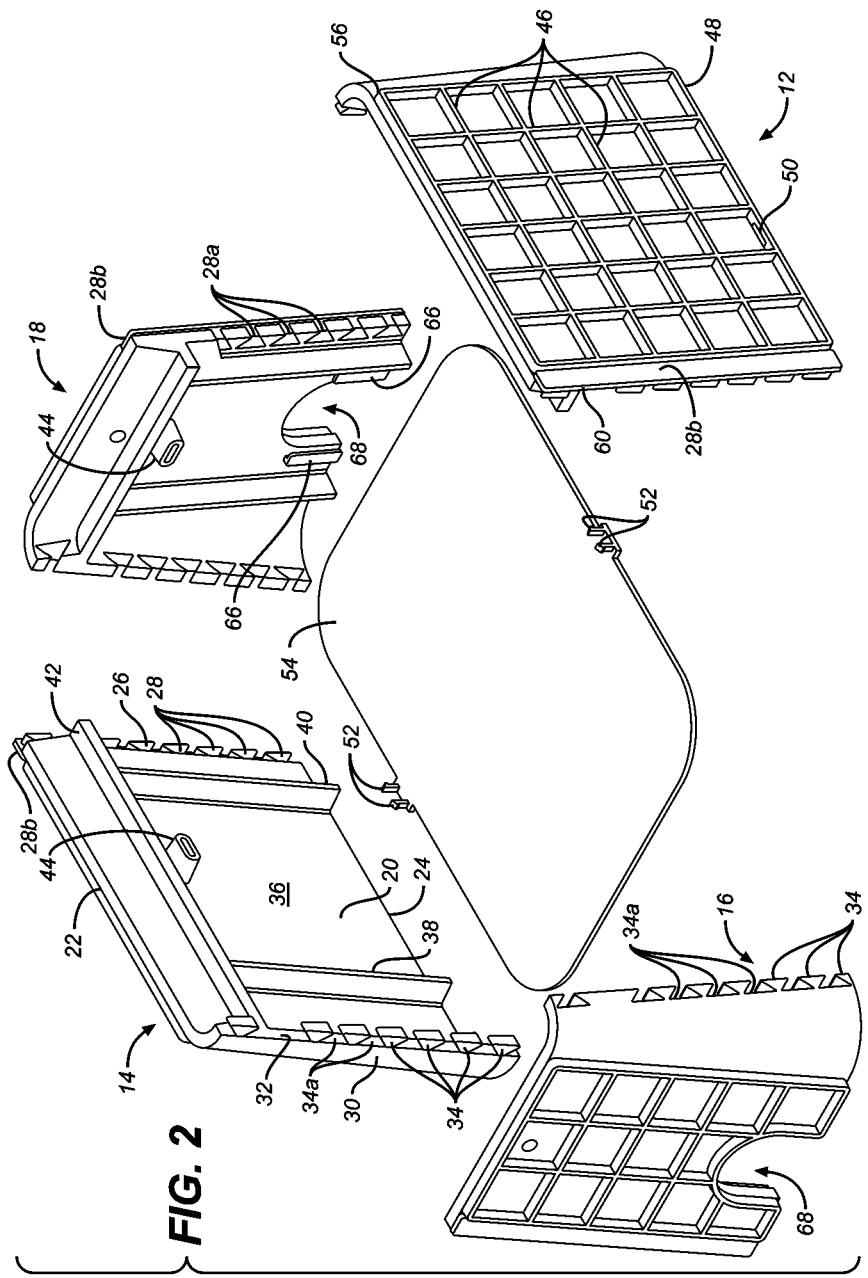
FIG. 2 is the same view showing the box disassembled.
Figure 3:
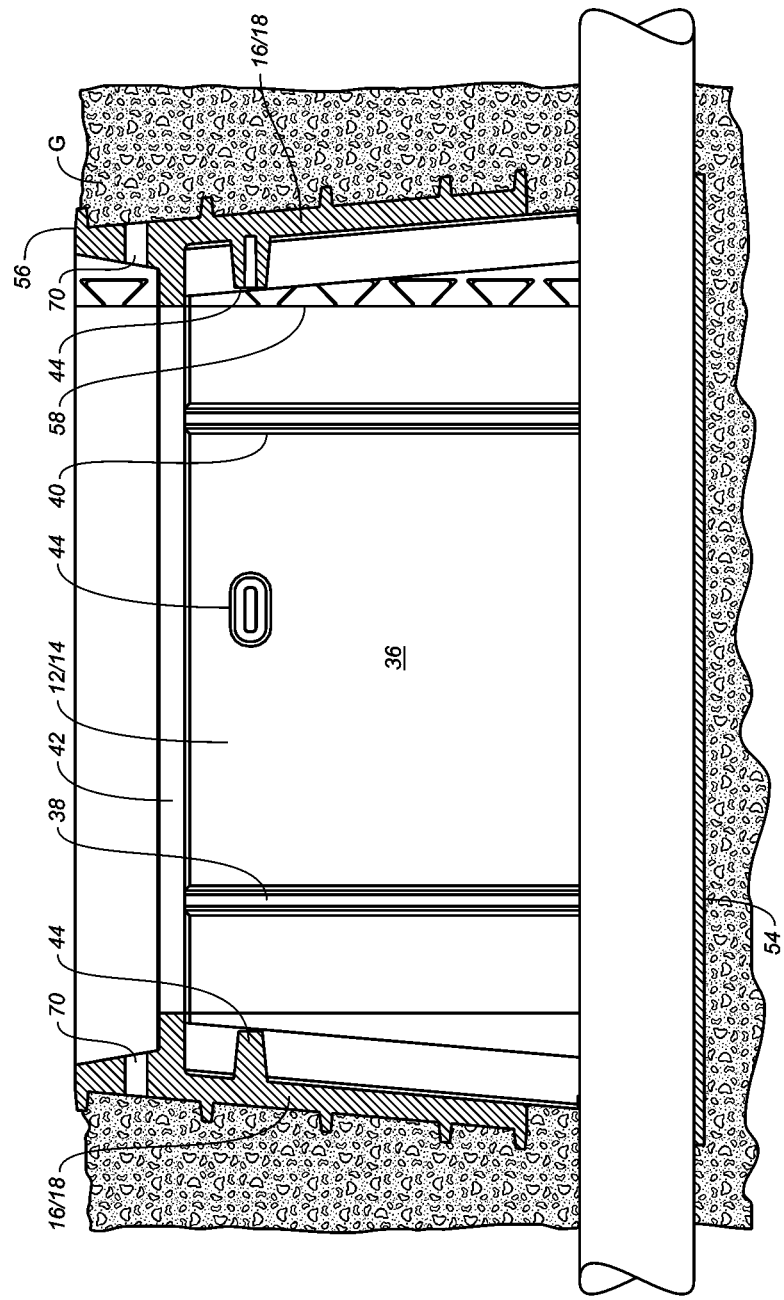
FIG. 3 is a cross-sectional end view in elevation showing the box installed underground with a pipe or conduit inserted through the end mouse holes schematic side view in elevation thereof.

FIG. 1 is a perspective view showing the box assembled and generally suited for in-ground installation. FIG. 2 is an exploded view thereof, showing the box includes substantially identical first and second side panels 12, 14, and substantially identical first and second end panels, 16, 18. Each of the side and end panels is fabricated using one of any of a number of suitable manufacturing processes designed for manufacturing optimization, such processes including 3D printing and CNC machining, and various thermoforming and thermosetting processes, including polymer casting, vacuum forming, injection molding, extrusion, and blow molding.

As can be seen in a review of the drawings, and looking at side panel 14 as an exemplary panel showing features common to all panels in the assembly, the side and end panels each include a generally rectangular planar portion 20 having a top horizontal edge 22, a bottom horizontal edge 24, and a first interlocking (half-blind) vertical edge 26 having a plurality of interlocking male elements, e.g., dovetail pins or tails, 28, female sockets 28a, and a retaining rabbet strip 28b (concealing the interlocking elements on the outer side, i.e., the blind side). The opposing end 30 of the panel is arcuate and includes a 90-degree bend (which forms a corner of the assembled meter box) and terminates in an interlocking vertical edge 32 having a plurality of interlocking male elements 34 and female sockets 34a for end-to-end interlocking connection with the male and female elements (28, 28a) of an adjoining side or end panel.

Each side and end panel also includes a planar interior surface 36 with two vertically oriented interior ribs 38, 40 to increase structural rigidity. The vertical ribs support a horizontally disposed interior support ledge or flange 42 set below the top edge and which, when assembled, comprises a continuous and contiguous ledge on which a meter box lid may be securely placed.

It should be noted that the interlocking elements of the panel ends are shown as single lap (half-blind) dovetail elements—i.e., pins and tail sockets on a pin panel end, tails and pin sockets on a tail panel end—but those with skill will appreciate that digital fabrication technology enables interlocking joints in countless configurations, including fanciful jigsaw puzzle joints, shouldered dovetails, alternating double and triple dovetails, lapped dovetail, double lapped dovetail, shouldered alternating double and triple dovetails, hooked jigsaw halves, double jigsaw, gingko and gooseneck mortise and tenon, so on. The dovetails shown in the illustrated embodiment are elegant, exemplary, relatively easy to fabricate, and provide the structural integrity needed for the application, but they are a non-limiting embodiment.

Further, and still reciting features common to all panels, immediately below the ledge 42 on the interior side is a standoff 44 for connecting a bracket or other means for securing a communication system in its entirety and/or transmitter assembly or antenna to the meter box. As with other features thus far recited, standoffs are disposed on the interior side of each panel, side and end, though boxes adapted for particular meters and communications systems may include fewer or more standoffs according to system mounting requirements.

Still referring to FIG. 2, attention is directed to the first side panel 12, as this view clearly shows exterior surface features again common to all box panels. It is seen, for instance, that the rectangular planar portion 20 of the panel includes a grid of stiffening ribs 46, including horizontally-oriented and vertically-oriented ribs generally normal to one another, which combine to prevent out-of-plane distortions as well as migration in any direction when installed in ground. The lowermost rib 48 on the side panels includes a socket 50 for insertion of male snap fit elements 52 disposed on the upper side of a gopher panel 54.

The uppermost rib 56 of the panels is intended for positioning at about the level of surrounding ground G (see FIG. 3), where an interlocking end-to-end joint 58 can also be seen.

At the end of the planar rectangular portion, disposed in a vertical orientation, the rabbet strip may be integral or may comprise a discrete polymeric bar 60 welded across the pins and sockets of the interlocking elements, thereby making the joint in such an embodiment a half-blind dovetail (interlocking) end-to-end joint in assembly rather than a through dovetail joint.

Figure 4B:
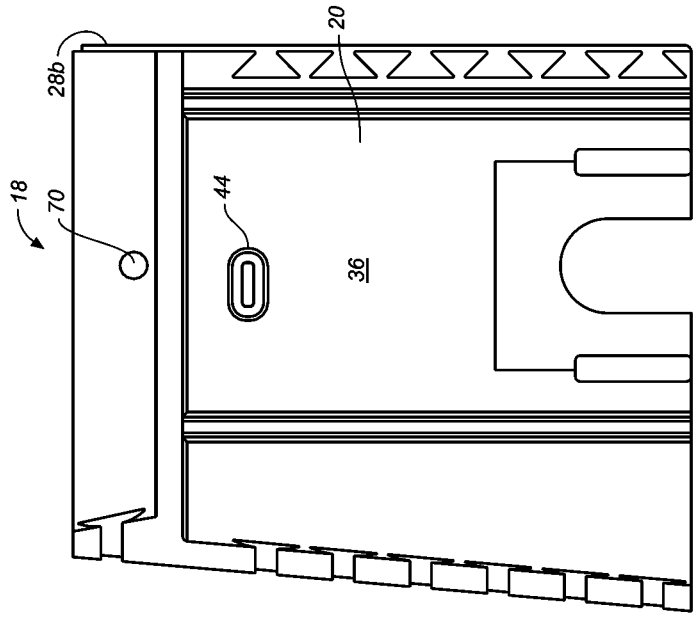
FIG. 4B is the same view with the door installed and lowered to adjust the mouse hole opening size.
Figure 4A:
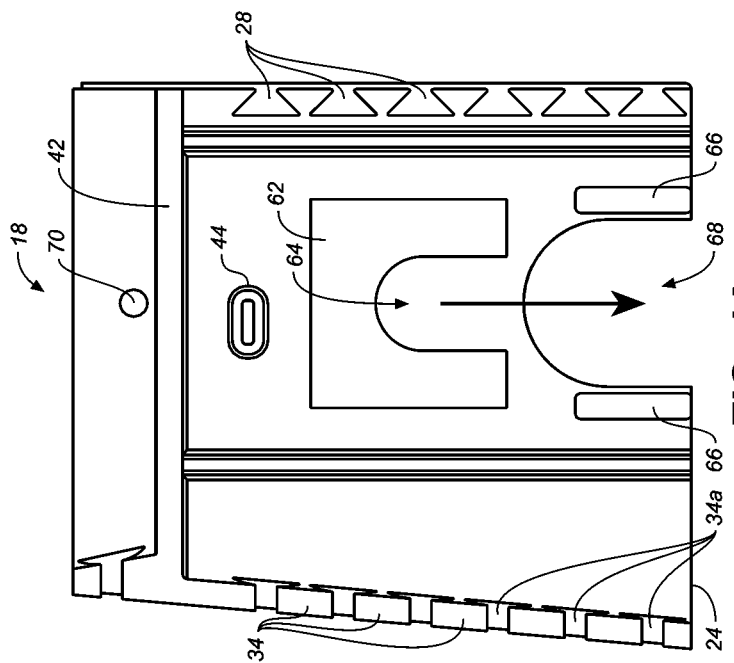
FIG. 4A is an end view in elevation of an interior portion of an end panel, featuring the guillotine door disposed above the mouse hole for is an upper perspective view showing the antenna bracket installed in a meter pit lid.

Referring now to FIG. 2 and more particularly to FIG. 4, a few features are unique to the end panels, 18, 20. While relative dimensions of the end panels and side panels are non-limiting, in embodiments the end panels may comprise a smaller area than the side panels, making the assembly substantially a rectangular and having inwardly sloping sides from bottom to top—in essence a tapered cube with an inward taper from bottom to top. The end panels are intended to receive a utility supply pipe or conduit (electricity, water, gas), which inserts into one end and exits the other. To prevent the incursion of dirt into the box interior and to prevent small animals (e.g., moles, gophers, voles, mice, etc.) from taking up nests or inhabiting the box, a sliding guillotine door 62 is provided with an arched opening 64, the size of which is selected according to the size of the supply pipe or conduit so as to provide little clearance and thereby a secure enclosure. The door is inserted into slots defines by set off stiles or rails 66 alongside the arched opening 68 in the end panels. Disposed slightly above the ledge 42 for the lid is a hole 70 for installation of a spring lock to secure the lid (lock not shown). When assembled, embodiments of the meter box meet a 22,500 lb. ANSI Tier 15 load rating. This makes it ideally suited for use in highly trafficked environments where vehicles may inadvertently roll over the meter box.

Figure 5:
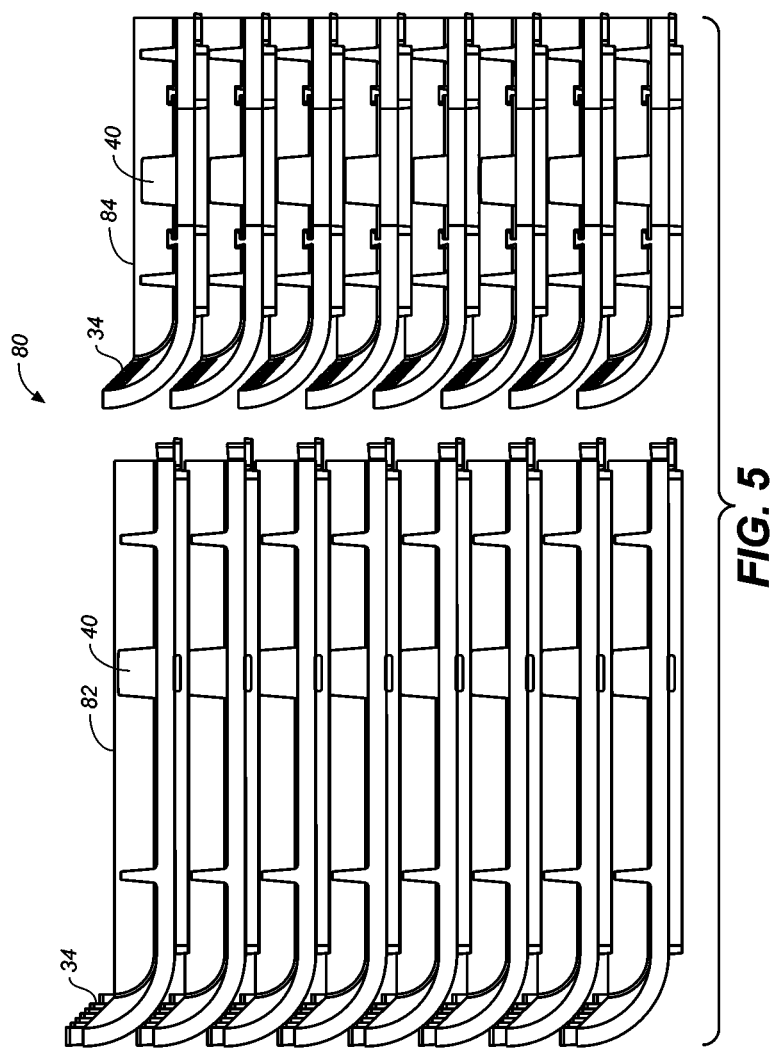
FIG. 5 is a side view in elevation of several dismantled in-ground boxes in a stacked in a nested configuration for shipping and transport.

Referring next to FIG. 5, there are shown a plurality of panels in a stacked and nested configuration 80 for shipment and storage, including a stack of side panels 82 and a stack of end panels 84. This view highlights a salient feature of the inventive meter box: viz., it is compact in storage and transport but strong in assembly with very few parts needed for effectively inseparable corner joints. Indeed, because the panels ship flat, the system enables shipment of 4.5 times as many units as conventional meter boxes. Assembly takes less than one minute in even unskilled hands.

From the foregoing, it is clear that when considered in its most essential aspect, the modular AMI/AMR in-ground meter box of the present invention necessarily includes only first and second side panels, each having an interior side and an exterior side; and first and second end panels, each having an interior side and an exterior side, wherein each of the side panels and end panels include a generally rectangular planar portion having a top edge, a bottom edge, a first interlocking end having a plurality of interlocking male and female features, an arcuate second end having a 90-degree bend forming a corner of the assembled meter box and terminating in a second interlocking end having a plurality of male and female features configured to selectively mate and interlock with paired male and female slots in the first interlocking end of an adjoining side and end panels. Box assembly and dismantling are simple and fast when uninstalled, requiring merely alignment of the interlocking panels and the delivery of a sharp blow with a first or mallet. When installed in ground, however, the meter box is virtually indestructible and is impenetrable to a degree suited for its use. The box panels are urged more tightly into their joined positions by compacting and moving soils and will not migrate in ground because of their exterior surface features. Thus, they will minimize stress on service pipes and conduits coupled to AMI/AMR equipment installed on brackets in the box. They will prevent intrusion and damage from burrowing animals and will withstand overhead forces imparted by vehicles and other heavy loads. Configured with integral arcuate corners to withstand extraordinary loads and never to come apart unintentionally, storage, packaging and shipment of the boxes are nonetheless facilitated by panel stacking and uniform component sizing. In short, they represent a notable advance over prior art underground meter boxes and are ideally adapted for large scale municipal utility projects.

The disclosure herein is sufficient to enable those with skill in the relevant art to practice the invention without undue experimentation. The disclosure further provides the best mode of practicing the invention now contemplated by the inventor.

While the particular meter box herein shown and disclosed in detail is fully capable of attaining the objects and providing the advantages stated herein, it is to be understood that it is merely illustrative of the presently preferred embodiment of the invention and that no limitations are intended to the detail of construction or design herein shown other than as defined in the appended claims. Accordingly, the proper scope of the present invention should be determined only by the broadest interpretation of the appended claims so as to encompass all such modifications as well as all relationships equivalent to those illustrated in the drawings and described in the specification.

What is claimed as invention is:

1. An AMI/AMR in-ground meter box, comprising:
   first and second side panels, each having an interior side and an exterior side; and
   first and second end panels, each having an interior side and an exterior side;
   wherein each of said side panels and end panels include a generally rectangular planar portion having a top edge, a bottom edge, a first interlocking end having a plurality of male elements and female slots forming the first interlocking end having a half-blind vertical edge, an arcuate second end having a 90-degree bend which forms a corner of the assembled meter box and terminating in a second interlocking end having a plurality of male elements and female slots configured to interlock with paired male elements and female slots in a first interlocking end of an adjoining side or end panel.

2. The AMI/AMR in-ground meter box of claim 1, wherein each of said end and side panels are fabricated from a polymeric material.

3. The AMI/AMR in-ground meter box of claim 1, wherein said first and second side panels are substantially identical.

4. The AMI/AMR in-ground meter box of claim 1, wherein said first and second end panels are substantially identical.

5. The AMI/AMR in-ground meter box of claim 1, wherein each of said side and end panels include a planar interior surface with two vertically oriented interior ribs to increase structural rigidity.

6. The AMI/AMR in-ground meter box of claim 5, wherein said vertical ribs on said interior surface of said side and end panels support a horizontally disposed interior support ledge or flange set below said top edge and which, when assembled, forms a continuous and contiguous ledge on which a meter box lid may be securely placed.

7. The AMI/AMR in-ground meter box of claim 1, wherein said interlocking male elements and female slots of said end and said side panels form a single overlap joint when coupled.

8. The AMI/AMR in-ground meter box of claim 7, wherein said interlocking male elements and female slots comprise dovetail structures.

9. The AMI/AMR in-ground meter box of claim 1, wherein said interlocking male elements and said female slots form interlocking elements selected from a group consisting of jigsaw puzzle joints, shouldered dovetails, alternating double and triple dovetails, lapped dovetail, double lapped dovetail, shouldered alternating double and triple dovetails, booked jigsaw halves, double jigsaw, ginko and gooseneck mortise and tenon.

10. The AMI/AMR in-ground meter box of claim 6, further including at least one standoff disposed below said ledge on said interior side of one of said first and second end panels or said first and second side panels for connecting a bracket or other connection means for securing a communication system or transmitter assembly or antenna to said meter box.

11. The AMI/AMR in-ground meter box of claim 1, wherein said exterior side of each of said side and end panels includes grid of stiffening ribs.

12. The AMI/AMR in-ground meter box of claim 11, wherein said stiffening ribs include horizontally-oriented and vertically-oriented rib generally normal to one another, and wherein a lowermost rib on said panels includes connecting structure for coupling a gopher panel to the bottom of an assembled meter box.

13. The AMI/AMR in-ground meter box of claim 12, wherein said connecting structure is a socket for insertion of male snap fit elements disposed on an upper side of a gopher panel.

14. The AMI/AMR in-ground meter box of claim 1, wherein said first interlocking end of said side an end panels includes a bar which conceals said male elements of joined interlocking first and second ends of said end and side panels.

15. The AMI/AMR in-ground meter box of claim 1, wherein said meter box tapers inwardly from bottom to top.

16. The AMI/AMR in-ground meter box of claim 1, wherein said end panels are configured with a utility supply pipe opening to receive a utility supply pipe or conduit.

17. The AMI/AMR in-ground meter box of claim 16, further including a sliding guillotine door on said utility supply pipe or conduit opening to limit the opening surrounding a supply pipe.

* * * * *